US011957000B2

(12) United States Patent
Zhang et al.

(10) Patent No.: US 11,957,000 B2
(45) Date of Patent: Apr. 9, 2024

(54) ORGANIC LIGHT EMITTING DIODE PANEL AND METHOD OF PREPARING THE SAME

(71) Applicant: SHENZHEN CHINA STAR OPTOELECTRONICS SEMICONDUCTOR DISPLAY TECHNOLOGY CO., LTD., Shenzhen (CN)

(72) Inventors: Letao Zhang, Shenzhen (CN); Liangfen Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 705 days.

(21) Appl. No.: 17/056,688

(22) PCT Filed: Oct. 21, 2020

(86) PCT No.: PCT/CN2020/122428
§ 371 (c)(1),
(2) Date: Nov. 18, 2020

(87) PCT Pub. No.: WO2022/056997
PCT Pub. Date: Mar. 24, 2022

(65) Prior Publication Data
US 2022/0310720 A1  Sep. 29, 2022

(30) Foreign Application Priority Data

Sep. 16, 2020 (CN) .......................... 202010971126.9

(51) Int. Cl.
*H10K 59/122* (2023.01)
*H10K 50/844* (2023.01)
(Continued)

(52) U.S. Cl.
CPC ......... *H10K 59/122* (2023.02); *H10K 50/844* (2023.02); *H10K 50/865* (2023.02); *H10K 71/00* (2023.02); *H10K 59/1201* (2023.02)

(58) Field of Classification Search
CPC .. H10K 59/122; H10K 50/844; H10K 50/865; H10K 71/00; H10K 59/1201; H10K 59/126
See application file for complete search history.

(56) References Cited

U.S. PATENT DOCUMENTS

2006/0153971 A1* 7/2006 Takehara ............... H10K 71/15
427/66
2007/0111369 A1* 5/2007 Chun .................... H10K 59/122
438/42
(Continued)

FOREIGN PATENT DOCUMENTS

CN 104659287 A 5/2015
CN 104752490 A 7/2015
(Continued)

OTHER PUBLICATIONS

International Search Report in International application No. PCT/CN2020/122428, dated May 27, 2021.
(Continued)

*Primary Examiner* — Herve-Louis Y Assouman
(74) *Attorney, Agent, or Firm* — PV IP PC; Wei Te Chung; Zhigang Ma (57) ABSTRACT

An organic light emitting diode display panel in this disclosure comprises a base substrate, an array layer disposed on the base substrate, and a planarization layer disposed on the array layer. The OLED display panel further comprises anodes disposed on the planarization layer, and a pixel definition layer located between the anodes adjacent to each other. A luminescent layer, a cathode, and an encapsulation layer are provided on the anodes. A preparation material of (Continued)

the pixel definition layer is a light-shading material. By the pixel definition layer made of a light-shading material, the light shading effect of the OLED display panel is greatly enhanced, and the influence of the lateral light leakage of the OLED display panel on the TFT device is prevented.

20 Claims, 2 Drawing Sheets

(51) Int. Cl.
*H10K 50/86* (2023.01)
*H10K 59/12* (2023.01)
*H10K 59/126* (2023.01)
*H10K 71/00* (2023.01)

(56) References Cited

U.S. PATENT DOCUMENTS

| | | | | |
|---|---|---|---|---|
| 2007/0275512 | A1* | 11/2007 | Jee | H01L 27/1288 438/149 |
| 2009/0096764 | A1* | 4/2009 | You | G06F 3/045 345/174 |
| 2018/0159075 | A1 | 6/2018 | Kim | |
| 2019/0189709 | A1* | 6/2019 | Hou | H10K 71/00 |
| 2019/0214442 | A1* | 7/2019 | Liu | H10K 59/124 |
| 2019/0334112 | A1* | 10/2019 | Lee | H10K 59/122 |

FOREIGN PATENT DOCUMENTS

| | | |
|---|---|---|
| CN | 106129264 A | 11/2016 |
| CN | 106816557 A | 6/2017 |
| CN | 106896564 A | 6/2017 |
| CN | 108091772 A | 5/2018 |
| CN | 108649052 A | 10/2018 |
| CN | 109148516 A | 1/2019 |
| CN | 109166879 A | 1/2019 |
| CN | 109616497 A | 4/2019 |
| CN | 110098220 A | 8/2019 |
| CN | 111092100 A | 5/2020 |
| CN | 111244134 A | 6/2020 |
| CN | 111613654 A | 9/2020 |
| WO | 2019119235 A1 | 6/2019 |

OTHER PUBLICATIONS

Written Opinion of the International Searching Authority in International application No. PCT/CN2020/122428, dated May 27, 2021.
Chinese Office Action in corresponding Chinese Patent Application No. 202010971126.9 dated Jan. 14, 2022, pp. 1-9.

* cited by examiner

ORGANIC LIGHT EMITTING DIODE PANEL AND METHOD OF PREPARING THE SAME

RELATED APPLICATIONS

This application is a Notional Phase of PCT Patent Application No. PCT/CN2020/122428 having international filing date of Oct. 21, 2020, which claims the benefit of priority of Chinese Patent Application No. 202010971126.9 filed on Sep. 16, 2020. The contents of the above applications are all incorporated by reference as if fully set forth herein in their entirety.

FIELD OF INVENTION

The present disclosure relates to an organic light emitting diode (OLED) display technical field, and specifically, to an OLED display panel and a method of preparing the same.

BACKGROUND OF INVENTION

There is a large amount of reflected light in an existing OLED display panel. A planarization layer and a pixel definition layer have high transmittance. The reflected light in the OLED display panel tends to directly illuminate TFT devices, which affects the normal display of the TFT devices. Therefore, there is a technical problem in the existing OLED display panel that the light transmittance of the pixel definition layer is too high.

SUMMARY OF DISCLOSURE

Technical Problem

Therefore, there is a technical problem in an existing OLED display panel that light transmittance of a pixel definition layer is too high.

Technical Solutions

One embodiment of the present disclosure provides an OLED display panel, which can alleviate the technical problem of excessively high light transmittance of the pixel definition layer in the existing OLED display panel.

One embodiment of the present disclosure provides a method of preparing an organic light emitting diode (OLED) display panel, comprising steps of:
providing a base substrate;
sequentially forming an array layer and a planarization layer on the base substrate;
forming a conductive layer on the planarization layer and patterning the conductive layer to form anodes;
preparing an organic photoresist with light-shading properties on the anodes to form an organic photoresist layer, and patterning the organic photoresist layer to form a pixel definition layer located between the anodes adjacent to each other;
using a plasma to fluorinate a surface of the pixel definition layer to form a hydrophobic layer on the surface of the pixel definition layer; and
sequentially forming a luminescent layer, a cathode, and an encapsulation layer on the anodes.

In one embodiment of the method of preparing the OLED display panel provided by the present disclosure, the step of forming the pixel definition layer further comprises steps of: preparing a black matrix material on the anodes to form an organic photoresist layer, and patterning the organic photoresist layer to form the pixel definition layer.

In one embodiment of the method of preparing the OLED display panel provided by the present disclosure, the step of forming the pixel definition layer further comprises steps of: preparing a red photoresist material on the anodes to form an organic photoresist layer, and patterning the organic photoresist layer to form the pixel definition layer.

In one embodiment of the method of preparing the OLED display panel provided by the present disclosure, the step of forming the hydrophobic layer further comprises a step of: performing a fluorination treatment on the surface of the pixel definition layer by feeding any one of fluorine-containing gases including nitrogen trifluoride, carbon tetrafluoride, and sulfur hexafluoride to form the hydrophobic layer.

In one embodiment of the method of preparing the OLED display panel provided by the present disclosure, the step of forming the hydrophobic layer further comprises a step of: performing a fluorination treatment on the surface of the pixel definition layer by feeding at least two of fluorine-containing gases including nitrogen trifluoride, carbon tetrafluoride, and sulfur hexafluoride to form the hydrophobic layer.

In one embodiment of the method of preparing the OLED display panel provided by the present disclosure, the step of forming the pixel definition layer further comprises a step of: coating a black matrix material on an entire surface of the anodes to form an organic photoresist layer, wherein the organic photoresist layer has a thickness ranging from 0.8 microns to 5 microns.

In one embodiment of the method of preparing the OLED display panel provided by the present disclosure, the step of forming the hydrophobic layer further comprises a step of: performing a fluorination treatment on the surface of the pixel definition layer by feeding a fluorine-containing gas to form the hydrophobic layer, wherein the hydrophobic layer has a thickness less than 0.2 microns.

In one embodiment of the method of preparing the OLED display panel provided by the present disclosure, the step of forming the array layer further comprises steps of: preparing a layer of inorganic passivation material on the base substrate, and defining openings by using a lithography process at positions corresponding to electrodes of thin film transistor (TFT) devices.

In one embodiment of the method of preparing the OLED display panel provided by the present disclosure, the step of forming the planarization layer further comprises steps of: forming an organic photoresist layer on the array layer, and defining openings at positions corresponding to electrodes of TFT devices to form the planarization layer.

In one embodiment of the method of preparing the OLED display panel provided by the present disclosure, the step of forming the anodes further comprises steps of: depositing a layer of metal on the planarization layer, and removing the metal outside patterns of the anodes by etching to form the anodes.

One embodiment of the present disclosure provide an OLED display panel, comprising a base substrate, an array layer disposed on the base substrate, and a planarization layer disposed on the array layer, wherein the OLED display panel further comprises anodes disposed on the planarization layer, a pixel definition layer located between the anodes adjacent to each other, and a luminescent layer, a cathode, and an encapsulation layer provided on the anodes, wherein a preparation material of the pixel definition layer is a light-shading material.

In one embodiment of the OLED display panel provided by the present disclosure, the light-shading material of the pixel definition layer is an organic light-shading material.

In one embodiment of the OLED display panel provided by the present disclosure, the organic photoresist layer has a thickness ranging from 0.8 microns to 5 microns.

In one embodiment of the OLED display panel provided by the present disclosure, the pixel definition layer has a hydrophobic layer formed thereon, a hydrophobic material of the hydrophobic layer is further disposed on a surface of the pixel definition layer close to the luminescent layer.

In one embodiment of the OLED display panel provided by the present disclosure, the hydrophobic material of the hydrophobic layer is further disposed on an inner surface of the pixel definition layer located at a luminescent area.

In one embodiment of the OLED display panel provided by the present disclosure, the array layer comprises TFT devices arranged in an array manner, the anodes comprise a metal film layer, an orthographic projection of the metal film layer and the pixel definition layer on the base substrate covers an orthographic projection of the TFT devices on the base substrate, and the metal film layer and the pixel definition layer are used for together blocking a reflected light travelling toward the TFT devices.

In one embodiment of the OLED display panel provided by the present disclosure, the pixel definition layer comprises a hydrophobic layer located at an upper surface of the pixel definition layer, and the hydrophobic layer at least comprises fluorine.

In one embodiment of the OLED display panel provided by the present disclosure, the preparation material of the hydrophobic layer further comprises carbon and oxygen.

In one embodiment of the OLED display panel provided by the present disclosure, the preparation material of the hydrophobic layer is obtained from an organic photo resist material which is fluorinated by a fluorine-containing gas, the hydrophobic layer has a thickness less than 0.2 microns, and an element composition of the hydrophobic layer is associated with elements of the organic photo resist material and the fluorine-containing gas.

In one embodiment of the OLED display panel provided by the present disclosure, the preparation material of the pixel definition layer is a black matrix material or a red color resist material, in the pixel definition layer under the hydrophobic layer, a ratio of an amount of fluorine to a total amount of carbon, oxygen, fluorine, and nitrogen is less than 8 percent.

Beneficial Effect

The OLED display panel in the present disclosure comprises a base substrate, an array layer disposed on the base substrate, and a planarization layer disposed on the array layer. The OLED display panel further comprises anodes disposed on the planarization layer, and a pixel definition layer located between the adjacent anodes. A luminescent layer, a cathode, and an encapsulation layer are provided on the anodes. It is characterized that a preparation material of the pixel definition layer is a light-shading material. By the pixel definition layer made of a light-shading material, the light shading effect of the OLED display panel is greatly enhanced, and the influence of lateral light leakage of the OLED display panel on the TFT devices is prevented.

BRIEF DESCRIPTION OF DRAWINGS

The following describes the specific embodiments of the present disclosure in detail with reference to the accompanying drawings, which will make the technical solutions and other beneficial effects of the present disclosure more clear.

DETAILED DESCRIPTION OF PREFERRED EMBODIMENTS

The technical solutions in embodiments of the present disclosure will be described clearly and completely in conjunction with the drawings in the embodiments of the present disclosure. Apparently, the described embodiments are only a part of the embodiments of the present disclosure, but not all of the embodiments. Based on the embodiments in the present disclosure, other embodiments obtained by those skilled in the art without creative work would fall within the protection scope of the present disclosure.

In the description of the present disclosure, it should be understood that the terms "center", "longitudinal", "lateral", "length", "width", "thickness", "upper", "lower", "front", "back", "left", "right", "vertical", "horizontal", "top", "bottom", "inner", "outer", "clockwise", "counterclockwise", etc., for indicating orientation or position are based on the orientation or position shown in the drawings, which are merely for the convenience of describing the present disclosure and simplifying the description, rather than for indicating or implying that the devices or elements referred to must have a specific orientation or should be constructed and operated with specific position, and thus cannot be understood as a limitation of the present disclosure. Moreover, the terms "first" and "second" are used for description only, and cannot be understood as indicating or implying relative importance, or the number of technical features indicated. Thus, features defined as "first" and "second" may explicitly or implicitly include one or more of the features. In the description of the present disclosure, "multiple" means two or more than two, unless it is specifically defined.

Figure 1:
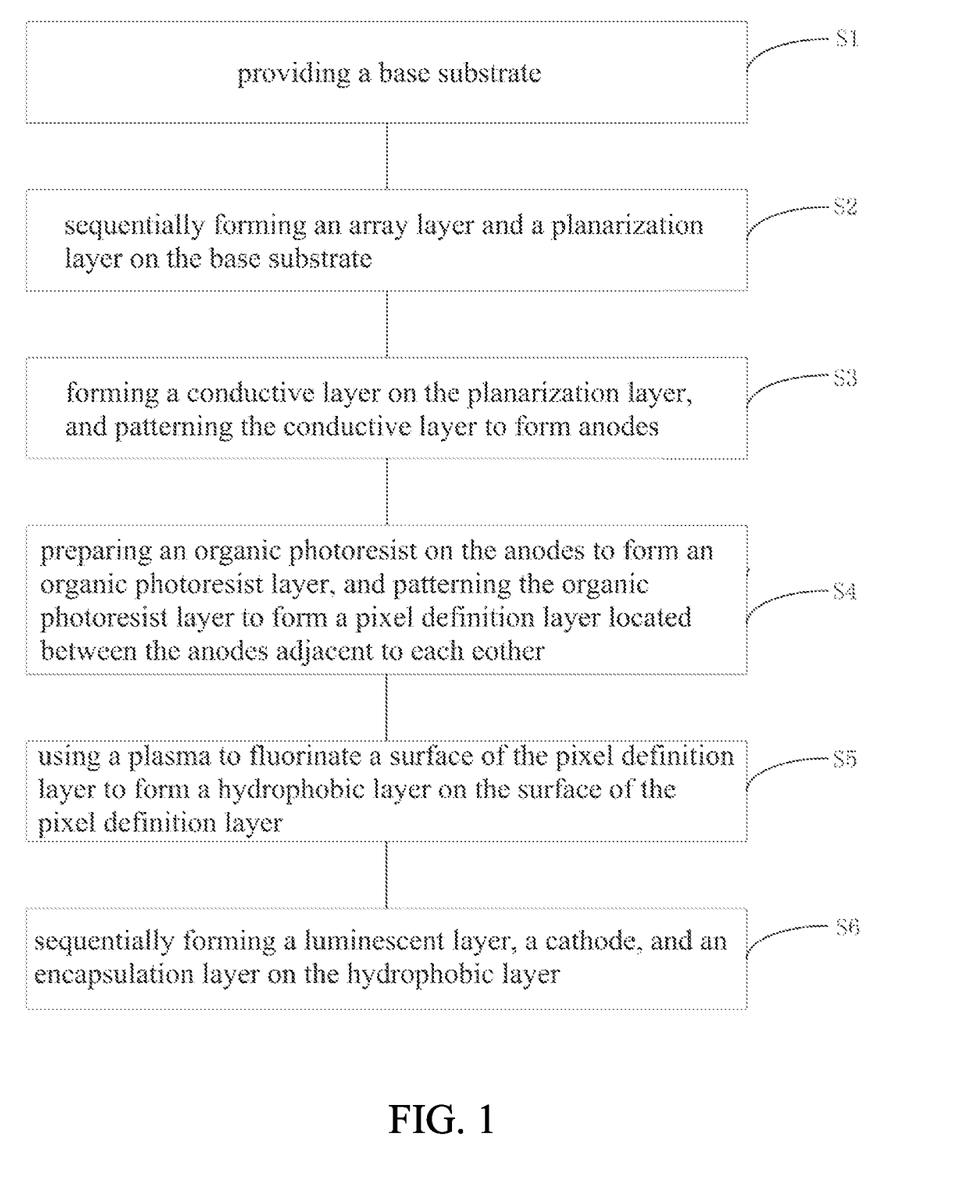
FIG. 1 is a schematic flow chart of a method of preparing an organic light emitting diode (OLED) display panel according to one embodiment of the present disclosure.

As shown in FIG. 1, the present disclosure provides a method of preparing an organic light emitting diode (OLED) display panel, comprising steps of:

S1: providing a base substrate 10;

S2: sequentially forming an array layer 20 and a planarization layer 30 on the base substrate 10;

S3: forming a conductive layer on the planarization layer 30, and patterning the conductive layer to form anodes 40;

S4: preparing an organic photoresist on the anodes 40 to form an organic photoresist layer, and patterning the organic photoresist layer to form a pixel definition layer 501 located between the anodes 40 adjacent to each other;

S5: using a plasma to fluorinate a surface of the pixel definition layer 501 to form a hydrophobic layer 502 on the surface of the pixel definition layer 501; and S6: sequentially forming a luminescent layer 60, a cathode 70, and an encapsulation layer 80 on the hydrophobic layer 502.

In one embodiment, the step of forming the pixel definition layer 501 further comprises steps of: preparing a black matrix material on the anodes 40 to form an organic photoresist layer, and patterning the organic photoresist layer to form the pixel definition layer 501.

In one embodiment, the step of forming the pixel definition layer 501 further comprises steps of: preparing a red photoresist material on the anodes 40 to form an organic photoresist layer, and patterning the organic photoresist layer to form the pixel definition layer 501.

In one embodiment, the step of forming the hydrophobic layer 502 further comprises a step of: performing a fluorination treatment on the surface of the pixel definition layer 501 by feeding any one of fluorine-containing gases including nitrogen trifluoride, carbon tetrafluoride, and sulfur hexafluoride to form the hydrophobic layer 502.

In one embodiment, the step of forming the hydrophobic layer 502 further comprises a step of: performing a fluorination treatment on the surface of the pixel definition layer by feeding at least two of fluorine-containing gases including nitrogen trifluoride, carbon tetrafluoride, and sulfur hexafluoride to form the hydrophobic layer 502.

In one embodiment, the step of forming the pixel definition layer 501 further comprises a step of: coating a black matrix material on an entire surface of the anodes 40 to form an organic photoresist layer, wherein the organic photoresist layer has a thickness ranging from 0.8 microns to 5 microns.

It is characterized that the organic photoresist layer has a low light-shading effect when the thickness of the organic photoresist layer is less than 0.8 microns.

It is characterized that the organic photoresist layer may be too thick when the thickness of the organic photoresist layer is greater than 5 microns.

In one embodiment, the step of forming the hydrophobic layer 502 further comprises a step of: performing a fluorination treatment on the surface of the pixel definition layer 501 by feeding a fluorine-containing gas to form the hydrophobic layer 502, wherein the hydrophobic layer 502 has a thickness less than 0.2 microns.

It is characterized that a ratio of an amount of fluorine to a total amount of carbon, oxygen, fluorine, and nitrogen is less than 8 percent in the pixel definition layer 501 under the hydrophobic layer 502.

In one embodiment, the step of forming the array layer 20 further comprises steps of: preparing a layer of inorganic passivation material on the base substrate 10, and defining openings by using a lithography process at positions corresponding to electrodes of thin film transistor (TFT) devices.

In one embodiment, the step of forming the planarization layer 30 further comprises steps of: forming an organic photoresist layer on the array layer 20, and defining openings at positions corresponding to electrodes of TFT devices to form the planarization layer 30.

In one embodiment, the step of forming the anodes 40 further comprises steps of: depositing a layer of metal on the planarization layer 30, and removing the metal outside patterns of the anodes by etching to form the anodes 40.

In one embodiment, in the step of providing the base substrate 10, the base substrate 10 may be rigid or flexible.

In one embodiment, the organic photoresist layer may be one of polyimide (PI) based organic photoresists and acrylic based organic photoresists.

In one embodiment, the way of patterning and defining openings at least comprises one of the process steps of coating photoresist, exposure, development, etc.

In one embodiment, the OLED display panel may be a top-emitting OLED panel with a semiconductor made of indium gallium zinc oxide.

Figure 2:
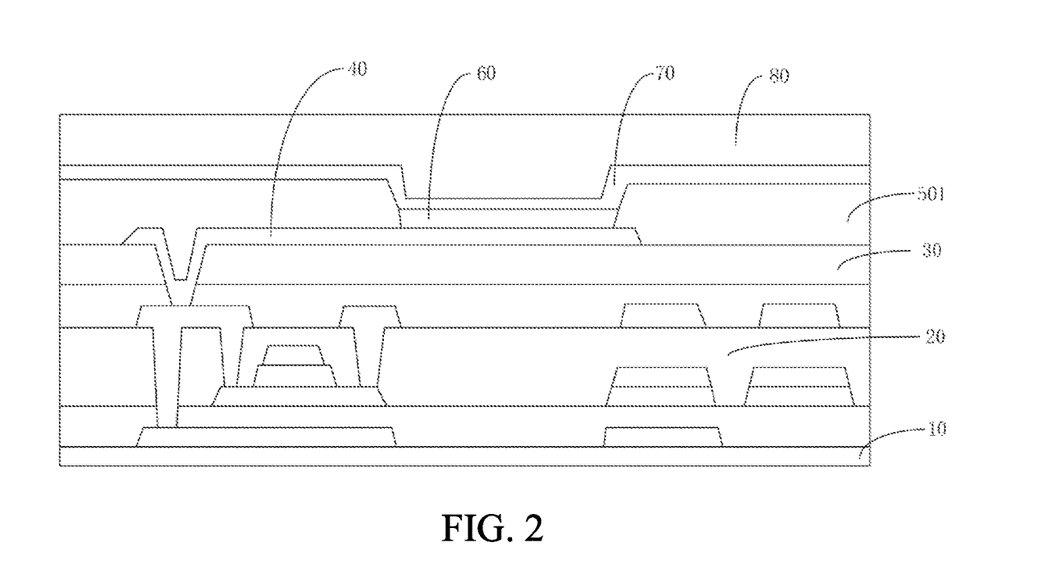
FIG. 2 is a first cross-sectional schematic view of an OLED display panel according to one embodiment of the present disclosure.

As shown in FIG. 2, one embodiment of the present disclosure provides an OLED display panel, comprising a base substrate 10, an array layer 20 disposed on the base substrate 10, and a planarization layer 30 disposed on the array layer 20, wherein the OLED display panel further comprises anodes 40, a pixel definition layer 501, a luminescent layer 60, a cathode 70, and an encapsulation layer 80 sequentially disposed on the planarization layer 30, wherein a preparation material of the pixel definition layer 501 is a light-shading material.

In this embodiment, the OLED display panel comprises a base substrate 10, an array layer 20 disposed on the base substrate 10, and a planarization layer 30 disposed on the array layer 20, wherein the OLED display panel further comprises anodes 40, a pixel definition layer 501, a luminescent layer 60, a cathode 70, and an encapsulation layer 80 sequentially disposed on the planarization layer 30, wherein a preparation material of the pixel definition layer 501 is a light-shading material. By the pixel definition layer 501 made of a light-shading material, the light shading effect of the OLED display panel is greatly enhanced, and the influence of the lateral light leakage of the OLED display panel on the TFT device is prevented.

It is characterized that the light-shading material of the pixel definition layer 501 is an organic light-shading material.

It is characterized that the anode 40 is in contact with the luminescent layer 60. An inner surface of the pixel definition layer 501 is in contact with the luminescent layer 60.

It is characterized that a hydrophobic layer 502 is disposed on a surface of the anodes 40 is in contact with the luminescent layer 60.

It is characterized that the hydrophobic layer 502 is also disposed on an inner surface of the pixel definition layer 501 in contact with the luminescent layer 60. When printing the luminescent layer 60, the hydrophobic layer 502 is used for preventing the printing ink from spreading from one sub-pixel area to another adjacent sub-pixel area.

It is characterized that an emitting functional layer includes the anode 40, the luminescent layer 60, and the cathode 70 from bottom to top.

It is characterized that the encapsulation layer 80 is disposed on the cathode 70.

It is characterized that an ultraviolet (UV) light blocking layer may be disposed between a passivation protection layer and the luminescent layer 60.

It is characterized that the TFT devices comprise a semiconductor layer, an interlayer insulating layer, a gate electrode, an insulating layer, a source electrode, and a drain electrode.

Figure 3:
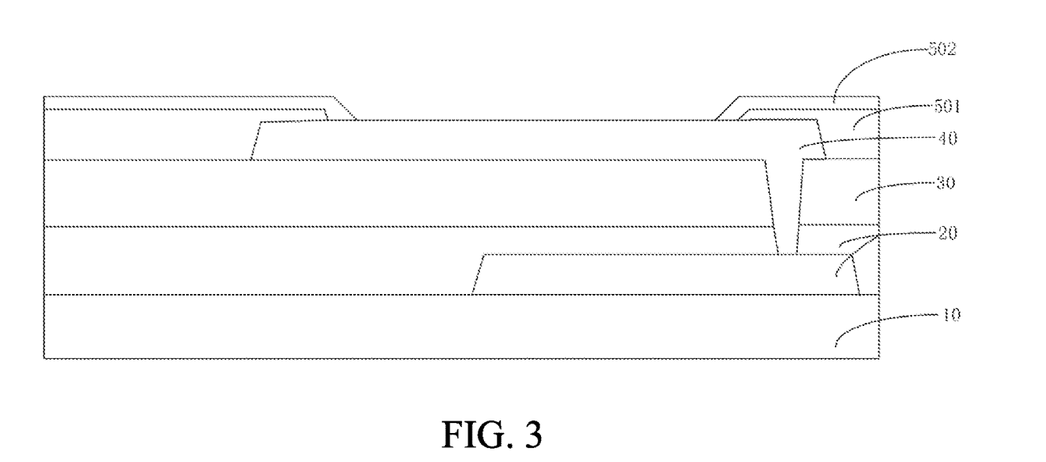
FIG. 3 is a second cross-sectional schematic view of an OLED display panel according to one embodiment of the present disclosure.

As shown in FIG. 3, in one embodiment, the pixel definition layer 501 has a hydrophobic layer 502 thereon. A hydrophobic material of the hydrophobic layer 502 is further disposed on an inner surface of the pixel definition layer 501 located at a luminescent area.

It is characterized that the hydrophobic layer 502 may be disposed on a surface of the pixel definition layer 501 is in contact with the luminescent layer 60.

It is characterized that the hydrophobic layer 502 may also be disposed on an upper surface of the pixel definition layer 501.

In one embodiment, the anode 40 comprises a metal film layer. The transmittance of the metal film layer is low. The metal film layer and the light-shading material of the pixel definition layer 501 together block a reflected light travelling toward the TFT devices under them.

In one embodiment, the array layer comprises TFT devices arranged in an array manner, the anodes comprise a metal film layer, an orthographic projection of the metal film layer and the pixel definition layer on the base substrate covers an orthographic projection of the TFT devices on the base substrate. The metal film layer and the pixel definition layer are used for together blocking a reflected light travelling toward the TFT devices.

In one embodiment, the pixel definition layer 501 comprises a hydrophobic layer 502. The hydrophobic layer 502 is located on an upper surface of the pixel definition layer 501, and the hydrophobic layer 501 at least comprises fluorine.

It is characterized that the preparation material of the hydrophobic layer 502 may include carbon.

It is characterized that the preparation material of the hydrophobic layer 502 may also include nitrogen.

It is characterized that the preparation material of the hydrophobic layer 502 may further include oxygen.

In this embodiment, the preparation material of the hydrophobic layer 502 is obtained from an organic photo resist material which is fluorinated by a fluorine-containing gas. The hydrophobic layer 502 has a thickness not more than 0.2 microns, and an element composition of the hydrophobic layer 502 is associated with elements of the organic photo resist material and the fluorine-containing gas.

It is characterized that when the fluorine-containing gas includes nitrogen trifluoride, the element composition of the hydrophobic layer 502 at least comprises fluorine and nitrogen.

It is characterized that when the fluorine-containing gas includes carbon tetrafluoride, the element composition of the hydrophobic layer 502 at least comprises fluorine and carbon.

It is characterized that when the fluorine-containing gas includes sulfur hexafluoride, the element composition of the hydrophobic layer 502 at least comprises fluorine and sulfur.

In one embodiment, the preparation material of the pixel definition layer 501 is a black matrix material or a red color resist material.

In one embodiment, the organic photoresist layer has a thickness ranging from 0.8 microns to 5 microns.

It is characterized that the organic photoresist layer has a low light-shading effect when the thickness of the organic photoresist layer is less than 0.8 microns.

It is characterized that the organic photoresist layer may be too thick when the thickness of the organic photoresist layer is greater than 5 microns.

It is characterized that when the thickness of the organic photoresist layer is 0.8 microns, it is beneficial to realize an ultra-thin OLED display panel, and the light-shading effect of the pixel definition layer 501 still meets the requirements of the OLED display panel.

It is characterized that when the thickness of the organic photoresist layer is 5 microns, the pixel definition layer 501 has the best light-shading effect, and the light-shading effect cannot be enhanced by continuing to increase the thickness of the organic photoresist layer.

In this embodiment, by adjusting the thickness of the organic photoresist layer, the different requirements of different products can be met. For OLED display panel products that need to be ultra-thin and do not require high light-shading effects, the thickness of the organic photoresist layer can be set to approach 0.8 microns; For OLED display panels that require a decent light-shading effect, the thickness of the organic photoresist layer can be set to approach 5 microns.

In this embodiment, the thickness of the organic photoresist layer is a sum of the thickness of the pixel definition layer 501 and the thickness of the hydrophobic layer 502.

In one embodiment, the hydrophobic layer 502 has a thickness less than 0.2 microns.

It is characterized that a ratio of an amount of fluorine to a total amount of carbon, oxygen, fluorine, and nitrogen is less than 8 percent in the pixel definition layer 501 under the hydrophobic layer 502.

It is characterized that the amount of fluorine in the pixel definition layer 501 gradually decreases in the direction away from the hydrophobic layer 502.

In one embodiment, a preparation material of a passivation layer is an inorganic passivation material.

In one embodiment, the base substrate 10 may be rigid and the base substrate 10 may be flexible.

In one embodiment, the organic photoresist layer may be one of polyimide (PI) based organic photoresists and acrylic based organic photoresists.

In one embodiment, the anode 40 may be any of indium tin oxide/silver/indium tin oxide, silver/indium tin oxide, aluminum/tungsten oxide, silver/gallium tin oxide and other composite structures.

As shown in FIG. 2, one embodiment of the present disclosure provides an OLED display device. The OLED display device includes an OLED display panel, a reflector, an optical film, a back plate, and a glass plate. The OLED display panel comprises a base substrate 10, an array layer 20 disposed on the base substrate 10, and a planarization layer 30 disposed on the array layer 20. The OLED display panel further comprises anodes 40 disposed on the planarization layer 30, and a pixel definition layer 501 located between the anodes 40 adjacent to each other. A luminescent layer 60, a cathode 70, and an encapsulation layer 80 are provided on the anodes 40. It is characterized that a preparation material of the pixel definition layer 501 is a light-shading material.

In this embodiment, the OLED display panel comprises a base substrate 10, an array layer 20 disposed on the base substrate 10, and a planarization layer 30 disposed on the array layer 20, wherein the OLED display panel further comprises anodes 40 disposed on the planarization layer 30, and a pixel definition layer 501 located between the adjacent anodes 40. A luminescent layer 60, a cathode 70, and an encapsulation layer 80 are provided on the anodes 40. It is characterized that a preparation material of the pixel definition layer 501 is a light-shading material. By the pixel definition layer 501 made of a light-shading material, the light shading effect of the OLED display panel is greatly enhanced, and the influence of the lateral light leakage of the OLED display panel on the TFT device is prevented.

It is characterized that the light-shading material of the pixel definition layer 501 is an organic light-shading material.

It is characterized that the anode 40 is in contact with the luminescent layer 60. An inner surface of the pixel definition layer 501 is in contact with the luminescent layer 60.

It is characterized that a hydrophobic layer 502 is disposed on a surface of the anodes 40 is in contact with the luminescent layer 60.

It is characterized that the hydrophobic layer 502 is also disposed on an inner surface of the pixel definition layer 501 in contact with the luminescent layer 60. When printing the luminescent layer 60, the hydrophobic layer 502 is used for preventing the printing ink from spreading from one sub-pixel area to another adjacent sub-pixel area.

It is characterized that an emitting functional layer includes the anode 40, the luminescent layer 60, and the cathode 70 from bottom to top.

It is characterized that the encapsulation layer 80 is disposed on the cathode 70.

It is characterized that an ultraviolet (UV) light blocking layer may be disposed between a passivation protection layer and the luminescent layer 60.

It is characterized that the TFT devices comprise a semiconductor layer, an interlayer insulating layer, a gate electrode, an insulating layer, a source electrode, and a drain electrode.

As shown in FIG. 3, in one embodiment of the OLED display device, the pixel definition layer 501 has a hydrophobic layer 502 thereon.

It is characterized that the hydrophobic layer 502 may be disposed on a surface of the pixel definition layer 501 in contact with the luminescent layer 60.

It is characterized that the hydrophobic layer 502 may also be disposed on an upper surface of the pixel definition layer 501.

In one embodiment of the OLED display device, a hydrophobic material of the hydrophobic layer 502 is further disposed on an inner surface of the pixel definition layer 501 located at a luminescent area In one embodiment of the OLED display device, the pixel definition layer 501 comprises a hydrophobic layer 502. The hydrophobic layer 502 is located at an upper surface of the pixel definition layer 501, and the hydrophobic layer 501 at least comprises fluorine.

It is characterized that the preparation material of the hydrophobic layer 502 may include carbon.

It is characterized that the preparation material of the hydrophobic layer 502 may also include nitrogen.

It is characterized that the preparation material of the hydrophobic layer 502 may further include oxygen.

In this embodiment, the preparation material of the hydrophobic layer 502 is obtained from an organic photo resist material which is fluorinated by a fluorine-containing gas. The hydrophobic layer 502 has a thickness not more than 0.2 microns, and an element composition of the hydrophobic layer 502 is associated with elements of the organic photo resist material and the fluorine-containing gas.

It is characterized that when the fluorine-containing gas includes nitrogen trifluoride, the element composition of the hydrophobic layer 502 at least comprises fluorine and nitrogen.

It is characterized that when the fluorine-containing gas includes carbon tetrafluoride, the element composition of the hydrophobic layer 502 at least comprises fluorine and carbon.

It is characterized that when the fluorine-containing gas includes sulfur hexafluoride, the element composition of the hydrophobic layer 502 at least comprises fluorine and sulfur.

In one embodiment of the OLED display device, the preparation material of the pixel definition layer 501 is a black matrix material or a red color resist material.

In one embodiment of the OLED display device, the organic photoresist layer has a thickness ranging from 0.8 microns to 5 microns.

It is characterized that the organic photoresist layer has a low light-shading effect when the thickness of the organic photoresist layer is less than 0.8 microns.

It is characterized that the organic photoresist layer may be too thick when the thickness of the organic photoresist layer is greater than 5 microns.

It is characterized that when the thickness of the organic photoresist layer is 0.8 microns, it is beneficial to realize an ultra-thin OLED display panel, and the light-shading effect of the pixel definition layer 501 still meets the requirements of the OLED display panel.

It is characterized that when the thickness of the organic photoresist layer is 5 microns, the pixel definition layer 501 has the best light-shading effect, and the light-shading effect cannot be enhanced by continuing to increase the thickness of the organic photoresist layer.

In this embodiment, by adjusting the thickness of the organic photoresist layer, the different requirements of different products can be met. For OLED display panel products that need to be ultra-thin and do not require high light-shading effects, the thickness of the organic photoresist layer can be set to approach 0.8 microns; For OLED display panels that require a good light-shading effect, the thickness of the organic photoresist layer can be set to approach 5 microns.

In this embodiment, the thickness of the organic photoresist layer is a sum of the thickness of the pixel definition layer 501 and the thickness of the hydrophobic layer 502.

In one embodiment of the OLDE display device, the hydrophobic layer 502 has a thickness less than 0.2 microns.

It is characterized that a ratio of an amount of fluorine to a total amount of carbon, oxygen, fluorine, and nitrogen is less than 8 percent in the pixel definition layer 501 under the hydrophobic layer 502.

It is characterized that the amount of fluorine in the pixel definition layer 501 gradually decreases in the direction away from the hydrophobic layer 502.

In one embodiment of the OLDE display device, a preparation material of a passivation layer is an inorganic passivation material.

In one embodiment of the OLDE display device, the base substrate 10 may be rigid and the base substrate 10 may be flexible.

In one embodiment of the OLDE display device, the organic photoresist layer may be one of polyimide (PI) based organic photoresists and acrylic based organic photoresists.

In one embodiment of the OLDE display device, the anode 40 may be any of indium tin oxide/silver/indium tin oxide, silver/indium tin oxide, aluminum/tungsten oxide, silver/gallium tin oxide and other composite structures.

In the OLED display panel and the OLED display device pixel provided by the present disclosure, the preparation material of the definition layer 501 is an organic photo resist material which effectively blocks the lateral leaked light and avoids the effect of the reflected light on the TFT devices. Additionally, the upper surface of the organic photo resist material is fluorinated to form the hydrophobic layer 502. Under the premise of ensuring the function of the pixel definition layer 501, the light illuminating the TFT devices is blocked. Besides, the pixel definition layer 501 in the OLED display panel and the OLED display device of the present disclosure has lower manufacturing costs.

The OLED display panel in the present disclosure comprises a base substrate, an array layer disposed on the base substrate, and a planarization layer disposed on the array layer. The OLED display panel further comprises anodes disposed on the planarization layer, and a pixel definition layer located between the anodes adjacent to each other. A luminescent layer, a cathode, and an encapsulation layer are provided on the anodes. It is characterized that a preparation material of the pixel definition layer is a light-shading material. By making the pixel definition layer into a light-shading material, the light shading effect of the OLED display panel is greatly enhanced, and the influence of the lateral light leakage of the OLED display panel on the TFT device is prevented.

One of the embodiments of the present disclosure is described in detail above. Specific examples are used for explaining the principles and implementation of the present disclosure. The descriptions of the above embodiments are only for help to understand the method of this disclosure and its core concept. Furthermore, for those skilled in the art, there will be modifications in the specific implementation and application scope according to the concept of this disclosure. In summary, the content of this description should not be understood as a limitation of this disclosure.

What is claimed is:

1. A method of preparing an organic light emitting diode (OLED) display panel, comprising steps of:
    providing a base substrate;
    sequentially forming an array layer and a planarization layer on the base substrate;
    forming a conductive layer on the planarization layer and patterning the conductive layer to form anodes;
    forming the pixel definition layer further comprises steps of: preparing a red photoresist material on the anodes to form a first organic photoresist layer, and patterning the first organic photoresist layer to form a pixel definition layer located between the anodes adjacent to each other;
    using a plasma to fluorinate a surface of the pixel definition layer to form a hydrophobic layer on the surface of the pixel definition layer; and
    sequentially forming a luminescent layer, a cathode, and an encapsulation layer on the anodes.

2. The method of preparing the OLED display panel according to claim 1, wherein the step of forming the hydrophobic layer further comprises a step of: performing a fluorination treatment on the surface of the pixel definition layer by feeding any one of fluorine-containing gases including nitrogen trifluoride, carbon tetrafluoride, and sulfur hexafluoride to form the hydrophobic layer.

3. The method of preparing the OLED display panel according to claim 1, wherein the step of forming the hydrophobic layer further comprises a step of: performing a fluorination treatment on the surface of the pixel definition layer by feeding at least two of fluorine-containing gases including nitrogen trifluoride, carbon tetrafluoride, and sulfur hexafluoride to form the hydrophobic layer.

4. The method of preparing the OLED display panel according to claim 1, wherein the first organic photoresist layer has a thickness ranging from 0.8 microns to 5 microns.

5. The method of preparing the OLED display panel according to claim 1, wherein the step of forming the hydrophobic layer further comprises a step of: performing a fluorination treatment on the surface of the pixel definition layer by feeding a fluorine-containing gas to form the hydrophobic layer, wherein the hydrophobic layer has a thickness less than 0.2 microns.

6. The method of preparing the OLED display panel according to claim 1, wherein the step of forming the array layer further comprises steps of: preparing a layer of inorganic passivation material on the base substrate, and defining openings by using a lithography process at positions corresponding to electrodes of thin film transistor (TFT) devices.

7. The method of preparing the OLED display panel according to claim 1, wherein the step of forming the planarization layer further comprises steps of: forming a second organic photoresist layer on the array layer, and defining openings at positions corresponding to electrodes of TFT devices to form the planarization layer.

8. The method of preparing the OLED display panel according to claim 1, wherein the step of forming the anodes further comprises steps of: depositing a layer of metal on the planarization layer, and removing the metal outside patterns of the anodes by etching to form the anodes.

9. An OLED display panel, comprising a base substrate, an array layer disposed on the base substrate, and a planarization layer disposed on the array layer, wherein the OLED display panel further comprises anodes disposed on the planarization layer, a pixel definition layer located between the anodes adjacent to each other, and a luminescent layer, a cathode, and an encapsulation layer provided on the anodes, wherein a material of the pixel definition layer is a red color resist material.

10. The OLED display panel according to claim 9, wherein the pixel definition layer has a hydrophobic layer formed thereon, a hydrophobic material of the hydrophobic layer is further disposed on a surface of the pixel definition layer close to the luminescent layer.

11. The OLED display panel according to claim 10, wherein the hydrophobic material of the hydrophobic layer is further disposed on an inner surface of the pixel definition layer located at a luminescent area.

12. The OLED display panel according to claim 10, wherein the array layer comprises TFT devices arranged in an array manner, the anodes comprise a metal film layer, an orthographic projection of the metal film layer and the pixel definition layer on the base substrate covers an orthographic projection of the TFT devices on the base substrate, and the metal film layer and the pixel definition layer are used for together blocking a reflected light travelling toward the TFT devices.

13. The OLED display panel according to claim 9, wherein the pixel definition layer comprises a hydrophobic layer located at an upper surface of the pixel definition layer, and the hydrophobic layer at least comprises fluorine.

14. The OLED display panel according to claim 13, wherein the preparation material of the hydrophobic layer further comprises carbon and oxygen.

15. The OLED display panel according to claim 13, wherein the preparation material of the hydrophobic layer is obtained from an organic photoresist material which is fluorinated by a fluorine-containing gas, the hydrophobic layer has a thickness less than 0.2 microns, and an element composition of the hydrophobic layer is associated with elements of the organic photoresist material and the fluorine-containing gas.

16. The OLED display panel according to claim 13, wherein in the pixel definition layer under the hydrophobic layer, a ratio of an amount of fluorine to a total amount of carbon, oxygen, fluorine, and nitrogen is less than 8 percent.

17. A method of preparing an organic light emitting diode (OLED) display panel, comprising steps of:
    providing a base substrate;
    sequentially forming an array layer and a planarization layer on the base substrate;
    forming a conductive layer on the planarization layer and patterning the conductive layer to form anodes;
    preparing an organic photoresist with light-shading properties on the anodes to form an organic photoresist layer, and patterning the organic photoresist layer to form a pixel definition layer located between the anodes adjacent to each other;

using a plasma to fluorinate a surface of the pixel definition layer to form a hydrophobic layer on the surface of the pixel definition layer; and sequentially forming a luminescent layer, a cathode, and an encapsulation layer on the anodes;

wherein the step of forming the hydrophobic layer further comprises a step of: performing a fluorination treatment on the surface of the pixel definition layer by feeding at least two of fluorine-containing gases including nitrogen trifluoride, carbon tetrafluoride, and sulfur hexafluoride to form the hydrophobic layer.

18. The method of preparing the OLED display panel according to claim 17, wherein the step of forming the pixel definition layer further comprises steps of: preparing a black matrix material on the anodes to form an organic photoresist layer, and patterning the organic photoresist layer to form the pixel definition layer.

19. The method of preparing the OLED display panel according to claim 17, wherein the step of forming the pixel definition layer further comprises steps of: preparing a red photoresist material on the anodes to form an organic photoresist layer, and patterning the organic photoresist layer to form the pixel definition layer.

20. The method of preparing the OLED display panel according to claim 17, wherein the step of forming the array layer further comprises steps of: preparing a layer of inorganic passivation material on the base substrate, and defining openings by using a lithography process at positions corresponding to electrodes of thin film transistor (TFT) devices.

* * * * *